United States Patent
Sugiyama et al.

(10) Patent No.: US 9,078,370 B2
(45) Date of Patent: Jul. 7, 2015

(54) SUBSTRATE WITH BUILT-IN ELECTRONIC COMPONENT

(75) Inventors: Yuichi Sugiyama, Tokyo (JP); Tatsuro Sawatari, Tokyo (JP); Yusuke Inoue, Tokyo (JP); Masashi Miyazaki, Tokyo (JP); Yoshiki Hamada, Tokyo (JP); Toshiyuki Kagawa, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 50 days.

(21) Appl. No.: 13/589,560

(22) Filed: Aug. 20, 2012

(65) Prior Publication Data

US 2014/0048321 A1  Feb. 20, 2014

(30) Foreign Application Priority Data

Aug. 15, 2012  (JP) .................................. 2012-180211

(51) Int. Cl.
*H05K 1/16* (2006.01)
*H05K 1/18* (2006.01)
*H05K 3/46* (2006.01)
*H05K 1/02* (2006.01)

(52) U.S. Cl.
CPC .................. *H05K 1/16* (2013.01); *H05K 1/185* (2013.01); *H05K 3/4697* (2013.01); *H05K 1/0271* (2013.01); *H05K 2201/0187* (2013.01)

(58) Field of Classification Search
CPC ........... H05K 1/16; H05K 1/18; H05K 1/119; H05K 1/145; H05K 2201/09036; H05K 1/0284; H05K 3/1258
USPC .................... 174/260, 262, 255, 250; 361/763
See application file for complete search history.

(56) References Cited

U.S. PATENT DOCUMENTS

| 5,780,776 | A  | * | 7/1998  | Noda ............................. 174/255 |
| 6,724,638 | B1 | * | 4/2004  | Inagaki et al. ................ 361/763 |
| 6,822,170 | B2 | * | 11/2004 | Takeuchi et al. .............. 174/258 |
| 6,909,054 | B2 | * | 6/2005  | Sakamoto et al. ............ 174/260 |
| 7,485,489 | B2 | * | 2/2009  | Bjorbell ........................ 438/106 |
| 7,738,256 | B2 | * | 6/2010  | Sawatari et al. .............. 361/761 |
| 7,855,894 | B2 | * | 12/2010 | Inagaki et al. ................ 361/763 |

(Continued)

FOREIGN PATENT DOCUMENTS

CN         1669374 A      9/2005
CN       102224771 A      10/2011

(Continued)

OTHER PUBLICATIONS

Chinese Office Action dated Feb. 11, 2014, in a counterpart Chinese patent application No. 201310355893.7. (Partial translation of the Office Action is attached as a concise explanation of relevance.).

(Continued)

*Primary Examiner* — Timothy Thompson
*Assistant Examiner* — Michael F McAllister
(74) *Attorney, Agent, or Firm* — Chen Yoshimura LLP

(57) ABSTRACT

Provided is a substrate with a built-in electronic component that can minimize an occurrence of a deformation such as warping or distortion of the substrate with a built-in electronic component, which is caused by a difference in rigidity between a region of low rigidity and a region of high rigidity that are formed in a core layer thereof. In the substrate with a built-in electronic component, electronic components 12 are respectively housed in a plurality of housing portions 11a1 that are formed in a core layer 11a, and in the core layer 11a, a plurality of openings 11a2 filled with an insulator 11k are formed.

7 Claims, 5 Drawing Sheets

(56) References Cited

U.S. PATENT DOCUMENTS

| | | |
|---|---|---|
| 2005/0157478 A1* | 7/2005 | Inagaki et al. ............... 361/763 |
| 2006/0191711 A1* | 8/2006 | Cho et al. ..................... 174/260 |
| 2006/0255440 A1 | 11/2006 | Miyazaki et al. |
| 2006/0291173 A1* | 12/2006 | Cho et al. ..................... 361/760 |
| 2007/0176613 A1* | 8/2007 | Ogawa et al. ................ 324/754 |
| 2008/0006928 A1 | 1/2008 | Miyazaki et al. |
| 2008/0041619 A1* | 2/2008 | Lee et al. ..................... 174/260 |
| 2009/0084596 A1* | 4/2009 | Inoue et al. .................. 174/261 |
| 2009/0215231 A1 | 8/2009 | Inoue |
| 2011/0203836 A1 | 8/2011 | Yokota et al. |
| 2012/0087097 A1* | 4/2012 | Hong et al. ................... 361/763 |

FOREIGN PATENT DOCUMENTS

| | | |
|---|---|---|
| JP | 2002-100880 A | 4/2002 |
| JP | 2003-078250 A | 3/2003 |
| JP | 2003-347741 A | 12/2003 |
| JP | 2010-118581 A | 5/2010 |
| JP | 2010-283043 A | 12/2010 |

OTHER PUBLICATIONS

Japanese Office Action dated Sep. 26, 2012, in a counterpart Japanese patent application No. 2012-180211.

* cited by examiner

SUBSTRATE WITH BUILT-IN ELECTRONIC COMPONENT

This application claims the benefit of Japanese Application No. 2012-180211, filed in Japan on Aug. 15, 2012, which is hereby incorporated by reference in its entirety.

TECHNICAL FIELD

The present invention relates to a substrate with a built-in electronic component that has an electronic component built therein, and more particularly, to a substrate with a built-in electronic component in which an electronic component is housed in a housing portion that is formed in a core layer.

BACKGROUND ART

Patent Document 1 below discloses a substrate with a built-in electronic component that has a structure in which a core substrate made of an insulator has a plurality of penetrating holes penetrating the core substrate in the thickness direction, and electronic components are inserted in the respective penetrating holes. Electrodes (terminals) of each electronic component are connected to wiring lines on wiring boards that are disposed on the respective sides of the core substrate in the thickness direction.

In the actual substrate with a built-in electronic component that is configured in such a manner, the respective penetrating holes are scattered throughout the core substrate in a top view due to the wiring arrangement. As a result, the core substrate has a region of low rigidity (region where penetrating holes are formed in a concentrated manner, for example) and a region of high rigidity (region where no penetration hole is formed, for example). When the difference in rigidity between the two regions is not large, it is not likely to cause a problem such as described below. However, when the difference in rigidity between the two regions is large, a deformation of the substrate with a built-in electronic component such as warping or distortion may occur due to an external force such as vibration or pressure given to the substrate with a built-in electronic component, or an internal force such as thermal expansion/shrinkage occurring inside the substrate with a built-in electronic component. This problem is more likely to occur as the thickness of the core substrate becomes smaller, in other words, as the substrate with a built-in electronic component is made thinner.

RELATED ART DOCUMENTS

Patent Documents

Patent Document 1: Japanese Patent Application Laid-Open Publication No. 2010-118581

SUMMARY OF THE INVENTION

Problems to be Solved by the Invention

An object of the present invention is to provide a substrate with a built-in electronic component that can minimize an occurrence of a deformation such as warping or distortion in the substrate with a built-in electronic component, which is caused by the difference in rigidity between the region of low rigidity and the region of high rigidity in the core layer.

Means for Solving the Problems

In order to achieve the above object, according to the present invention, a substrate with a built-in electronic component includes a core layer having a housing portion formed therein to house an electronic component, wherein the core layer has an opening formed therein, the opening being filled with an insulator.

Effects of the Invention

According to the present invention, when the housing portions are scattered throughout the core layer, causing the core layer to have a region of low rigidity and a region of high rigidity, and even when the difference in rigidity between the two regions is large, because the openings filled with an insulator are formed in a region where no housing portion is formed (region of high rigidity), the difference in rigidity between that region and the region of low rigidity can be reduced. This makes it possible to minimize an occurrence of a deformation such as warping or distortion of the substrate with a built-in electronic component, which is caused by the difference in rigidity between the two regions.

The above-mentioned object, other objects, features, and effects of the present invention will become apparent from the descriptions that follow and the appended drawings.

DETAILED DESCRIPTION OF EMBODIMENTS

Figure 1:
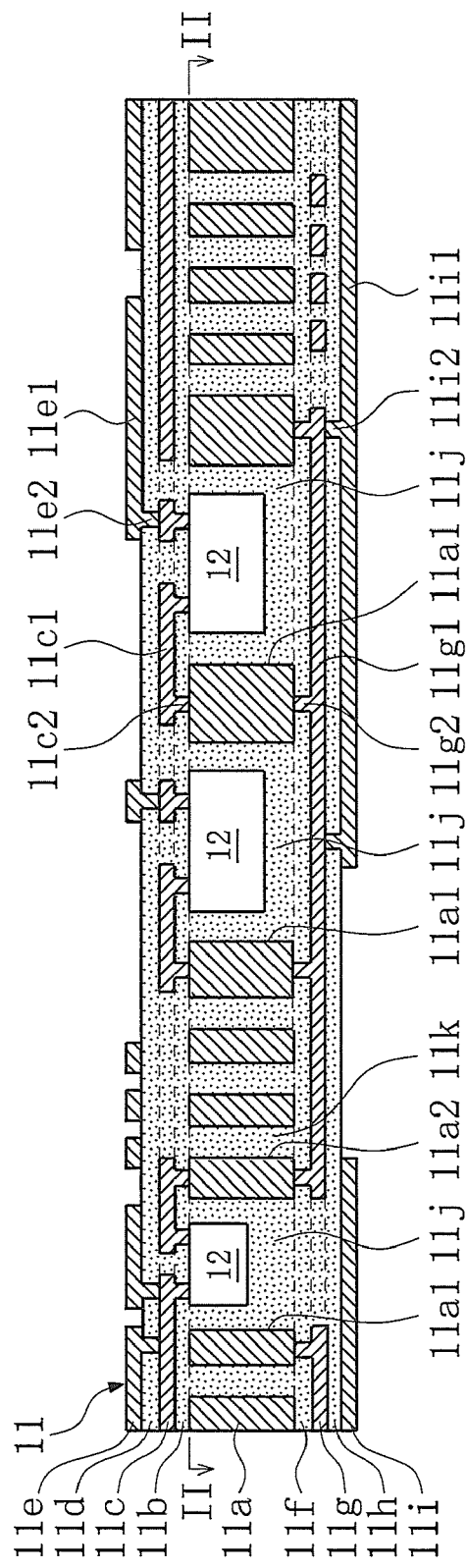
FIG. 1 is a vertical cross-sectional view of a substrate with a built-in electronic component to which the present invention is applied.

First, with reference to FIGS. 1 and 2, a configuration of the substrate with a built-in electronic component to which the present invention is applied will be explained. FIG. 1 is a cross-sectional view along the line I-I in FIG. 2, but the cross section of an electronic component 12 is not shown in FIG. 1.

Figure 2:
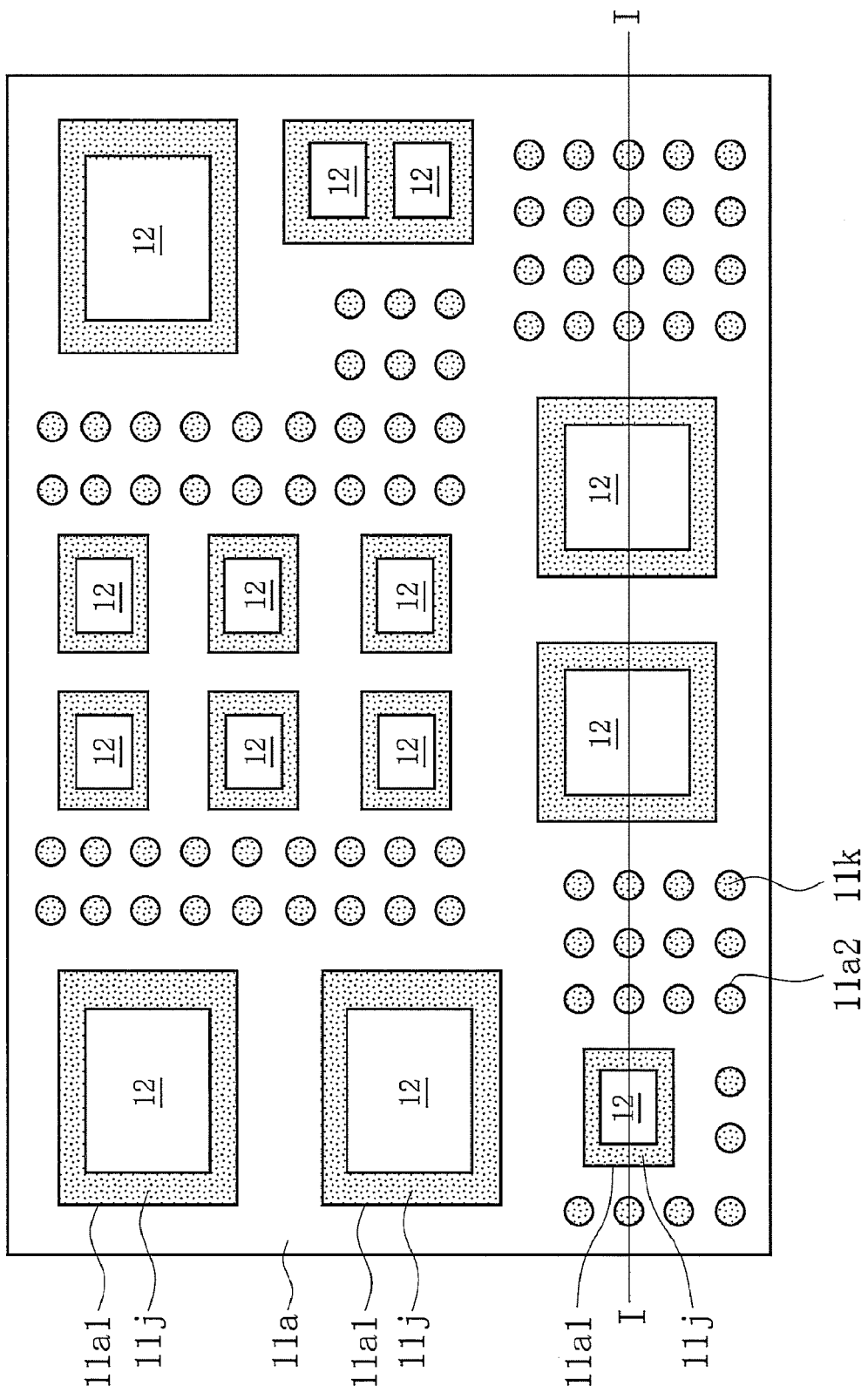
FIG. 2 is a plan view on a plane defined by the line II-II of FIG. 1.

The substrate with built-in electronic components (no reference character is given) shown in FIGS. 1 and 2 has a substrate 11 and a plurality of electronic components 12 built therein. In the substrate with built-in electronic components, a prescribed circuit that includes the plurality of electronic components 12 is constructed three-dimensionally through a core layer 11$a$ described below, respective wiring lines 11$c$1, 11$e$1, 11$g$1, and 11$i$1 described below, and respective via conductors 11$c$2, 11$e$2, 11$g$2, and 11$i$2 described below.

The substrate 11 includes the core layer 11$a$ having a prescribed thickness, a first insulating layer 11$b$ formed on the top surface (first main surface) of the core layer 11$a$, a first conductive layer 11$c$ formed on the top surface of the first insulating layer 11$b$, a second insulating layer 11$d$ formed on the top surface of the first conductive layer 11$c$, a second conductive layer 11$e$ formed on the top surface of the second insulating layer 11$d$, a third insulating layer 11$f$ formed on the bottom surface (second main surface) of the core layer 11$a$, a third conductive layer 11$g$ formed on the bottom surface of the third insulating layer 11$f$, a fourth insulating layer 11$h$ formed on the bottom surface of the third conductive layer 11$g$, and a fourth conductive layer 11$i$ formed on the bottom surface of the fourth insulating layer 11$h$.

The core layer 11a is made of a metal such as copper or a copper alloy, and the thickness thereof is in a range of 35 to 500 μm, for example. In the core layer 11a, a plurality of housing portions 11a1 that are made of penetrating holes that penetrate the core layer 11a in the thickness direction are formed in prescribed locations. Each housing portion 11a1 has a substantially square or substantially rectangular cross section, and the opening size of each housing portion 11a1 corresponds to the size of each electronic component 12 that is housed therein.

The core layer 11a also has a plurality of openings 11a2 that are made of penetrating holes that penetrate the core layer 11a in the thickness direction. The openings 11a2 are formed in a region where no housing portion 11a1 is formed (region of high rigidity), and more preferably, in a region not affecting the circuit that is constructed in the substrate with built-in electronic components. Each opening 11a2 has a substantially circular cross section, and the opening size thereof substantially coincides with each other. However, the opening area of each opening 11a2 is smaller than the opening area of each housing portion 11a1. The function of these openings 11a2 will be described later.

The insulating layers 11b, 11d, 11f, and 11h are made of thermosetting plastic such as an epoxy resin, a polyimide, a bismaleimide-triazine resin, or plastic that is obtained by adding fillers for reinforcement to these resins, and the thickness of each layer is in a range of 5 to 50 μm, for example. The conductive layers 11c, 11e, 11g, and 11i are made of a metal such as copper or a copper alloy, and the thickness of each layer is in a range of 5 to 110 μm, for example.

In the respective conductive layers 11c, 11e, 11g, and 11i, wiring lines 11c1, 11e1, 11g1, and 11i1 that are used as signal wiring lines or ground wiring lines are patterned two-dimensionally.

In the respective insulating layers 11b, 11d, 11f, and 11h, via conductors 11c2, 11e2, 11g2, and 11i2 that may or may not be formed continuously from the wiring lines 11c1, 11e1, 11g1, or 11i1 are formed. The respective via conductors 11c2, 11e2, 11g2, and 11i2 are made of a metal such as copper or a copper alloy, and the maximum diameter thereof is in a range of 10 to 70 μm, for example.

Respective gaps between the conductive layers 11c, 11g and the wiring lines 11c1, 11g1, which are patterned in these conductive layers, and respective gaps between the wiring lines 11c1, 11g1 and pad portions of the pad-shaped via conductors 11c2, 11g2 are filled with thermosetting plastic such as an epoxy resin, a polyimide, a bismaleimide-triazine resin, or plastic that is obtained by adding fillers for reinforcement to these resins.

The electronic components 12 are appropriately selected from small electronic components such as capacitors, inductors, and resistors, and relatively large electronic components such as a filter chip and an IC chip. The respective electronic components 12 are housed in the housing portions 11a1 having the corresponding sizes, and terminals (not shown) on the respective top surfaces thereof are connected to the bottom surfaces of the via conductors 11c2.

Respective gaps between the electronic components 12 housed in the respective housing portions 11a1 and inner walls of the housing portions 11a1 are filled with an insulator 11j to prevent the respective electronic components 12 from making contact with the core layer 11a made of a metal, thereby sealing and insulating the electronic components 12. The plurality of openings 11a2 formed in the core layer 11a are also filled with an insulator 11k. The insulators 11j and 11k are made of thermosetting plastic such as an epoxy resin, a polyimide, a bismaleimide-triazine resin, or plastic that is obtained by adding fillers for reinforcement to these resins.

Below, an example of a process of housing the electronic components 12 in the respective plurality of housing portions 11a1 formed in the core layer 11a will be explained.

Figure 3A:
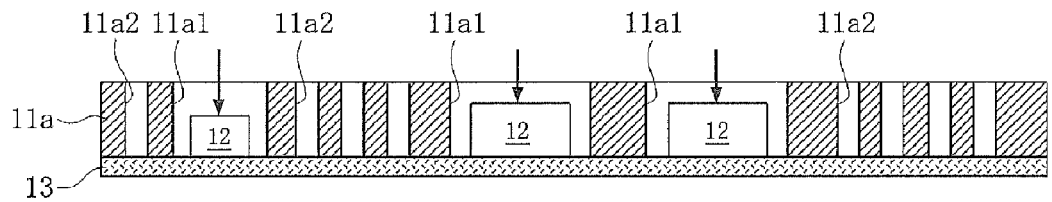
FIGS. 3A to 3C show an example of an electronic component housing process in the substrate with a built-in electronic component shown in FIGS. 1 and 2.

In the electronic component housing process, as shown in FIG. 3A, the core layer 11a having a plurality of housing portions 11a1 and a plurality of openings 11a2 formed therein is prepared, and an adhesion sheet 13 is attached to the bottom surface of the core layer 11a. This adhesion sheet 13 has an adhesion layer on at least the top surface thereof, and the adhesion layer is made of a photo-curable or thermo-curable adhesion material. Thereafter, the electronic components 12 are inserted into the respective housing portions 11a1 of the core layer 11a from above such that the respective bottom surfaces thereof (surfaces where the terminals are disposed) make contact with the adhesion sheet 13. Next, the adhesion sheet 13 undergoes a light or heat treatment so as to cure at least the portions where the electronic components 12 are in contact with, thereby tacking the electronic components 12 that were inserted in the respective housing portions 11a1.

Figure 3B:
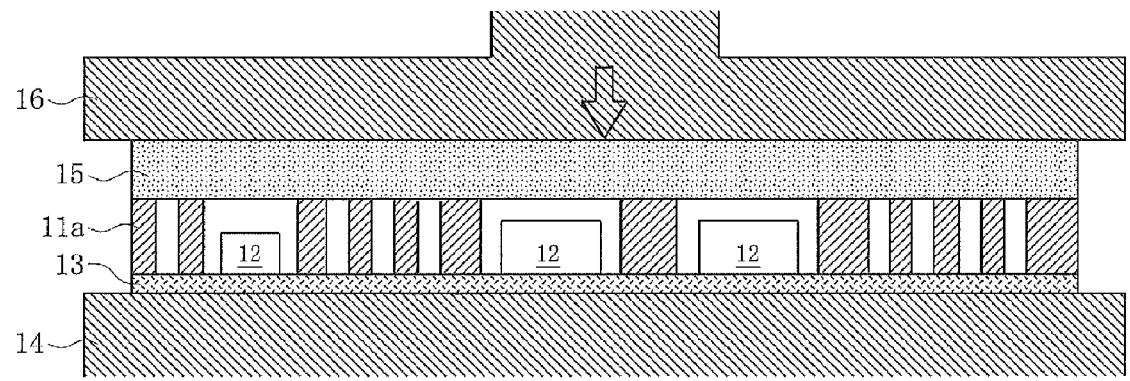
Figure 3C:
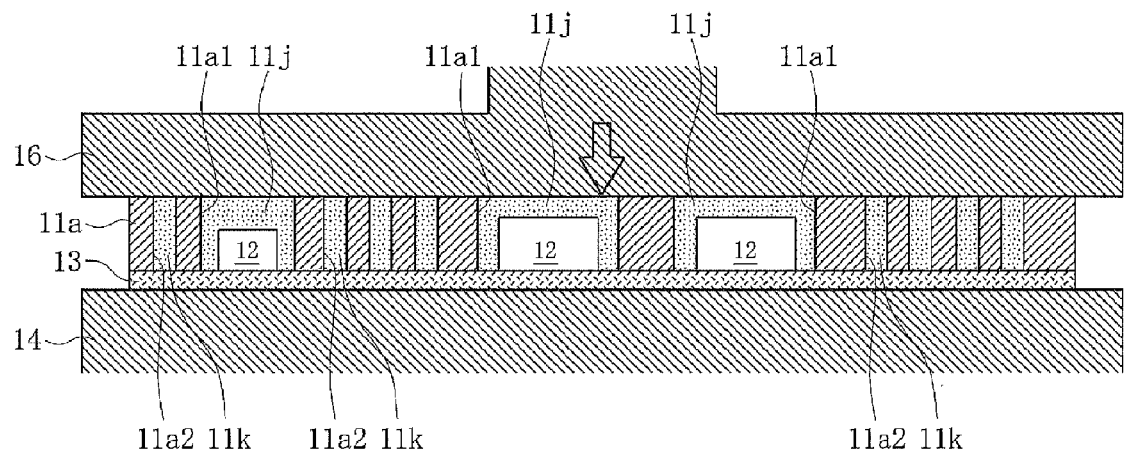

After tacking the electronic components 12, as shown in FIG. 3B, the core layer 11a is placed on a table 14, and a sheet 15 is placed on the top surface of the core layer 11a. The sheet 15 is made of an intermediate material of the above-mentioned thermosetting plastic, i.e., "intermediate material of thermosetting plastic that can be formed by heat and pressure and that can be cured by heat." Thereafter, a press plate 16 to apply heat and pressure to the sheet 15 is lowered while maintaining the substantially parallel position of the bottom surface thereof relative to the top surface of the core layer 11a. By lowering the press plate 16, the intermediate material (sheet 15) is plastically-deformed, and as shown in FIG. 3C, the intermediate material enters and fills the gaps between the electronic components 12 placed in the respective housing portions 11a1 and the inner walls of the housing portions 11a1. The intermediate material also enters and fills the respective openings 11a2.

Thereafter, the intermediate material filled in the respective gaps and the respective openings 11a2 is thermally cured. This way, the respective insulators 11j and 11k are formed, and the electronic components 12 in the respective housing portions 11a1 are affixed by the insulator 11j.

Next, the function of the openings 11a2 in the substrate with built-in electronic components shown in FIGS. 1 and 2 will be explained.

As shown in FIG. 2, a plurality of housing portions 11a1 are scattered throughout the core layer 11a in a top view due to the arrangement of the respective wiring lines 11c1, 11e1, 11g1, and 11i1 and the respective via conductors 11c2, 11e2, 11g2, and 11i2, which causes the core layer 11a to have a region of low rigidity (region where the housing portions 11a1 are formed in a concentrated manner, for example) and a region of high rigidity (region where no housing portion 11a1 is formed, for example). When the difference in rigidity between the two regions is not large, it is not likely to cause a problem such as described below, but when the difference in rigidity between the two regions is significant, a deformation of the substrate with built-in electronic components such as warping or distortion may occur as a result of an external force such as vibration or pressure given to the substrate with built-in electronic components, or an internal force such as thermal expansion/shrinkage occurring inside the substrate with built-in electronic components. The problem is more likely to occur as the thickness of the core layer 11a becomes smaller, in other words, as the substrate with built-in electronic components is made thinner.

However, as shown in FIGS. 1 and 2, a plurality of openings 11a2 filled with the insulator 11k are formed in a region of the core layer 11a where no housing portions 11a1 are provided (region of high rigidity), and the rigidity of the region of high rigidity is lowered due to the presence of the openings 11a2. That is, even when a plurality of housing portions 11a1 are scattered throughout the core layer 11a, causing the core layer 11a to have a region of low rigidity and a region of high rigidity, and the difference in rigidity between the two regions is significant, by forming the plurality of openings 11a2 filled with the insulator 11k in the region of high rigidity, the difference in rigidity between that region and the region of low rigidity can be reduced, preferably to nearly zero. This makes it possible to minimize an occurrence of a deformation such as warping or distortion of the substrate with built-in electronic components, which is caused by the difference in rigidity between the two regions, even when the thickness of the core layer 11a is made smaller, and the substrate with built-in electronic components is made thinner.

In the "step of filling gaps between the electronic components 12 in the respective housing portions 11a1 and the inner walls of the housing portions 11a1 by making the intermediate material flow therein," which is performed in the above-mentioned process of housing the electronic components, it is ideal if the intermediate material flows into a space around each electronic component 12 with a substantially even flow volume. If the flow volume is different (uneven) between two sides of the electronic component 12, for example, this difference (unevenness) may cause a force exceeding the tacking strength to act on the electronic component 12, and consequently, the electronic component 12 may be moved or tilted.

However, when at least one opening 11a2 is formed near a part of the opening edge of the housing portion 11a1, and more preferably, when a plurality of openings 11a2 that are lined up at a certain interval are formed so as to be substantially parallel with at least one side of the opening of the housing portion 11a1, the intermediate material also flows into the openings 11a2, which makes it possible to adjust the flow volume of the intermediate material flowing into the housing portions 11a1, thereby reducing the difference (unevenness) in flow volume. As a result, the electronic component 12 can be prevented from being moved or tilted when the intermediate material flows into each gap.

Because each of the openings 11a2 has a substantially circular cross section, the intermediate material can flow into the openings 11a2 smoothly without creating spaces therein, and therefore, the openings 11a2 filled with the insulator 11k can be formed effectively.

Next, effects of the substrate with built-in electronic components shown in FIGS. 1 and 2 will be explained.

(E1) In the substrate with built-in electronic components, even when a plurality of housing portions 11a1 are scattered throughout the core layer 11a, causing the core layer 11a to have a region of low rigidity and a region of high rigidity, and the difference in rigidity between the two regions is significant, by forming a plurality of openings 11a2 filled with the insulator 11k in the region where the housing portions 11a1 are not formed (region of high rigidity), the difference in rigidity between that region and the region of low rigidity can be reduced, preferably to nearly zero. This makes it possible to minimize an occurrence of a deformation such as warping or distortion of the substrate with built-in electronic components, which is caused by the difference in rigidity between the two regions, even when the thickness of the core layer 11a is made smaller, and the substrate with built-in electronic components is made thinner.

Because it is possible to minimize the occurrence of a deformation such as warping or distortion of the substrate with built-in electronic components, it is also possible to minimize an occurrence of a defect in the substrate with built-in electronic components such as layer peeling or wiring breakage, which is caused by the deformation.

Although it is difficult to completely eliminate the difference in rigidity between the two region, the difference in rigidity between the two regions can be reduced to nearly zero, in other words, it is possible to form the openings 11a2 such that the rigidity of the core layer 11a become substantially uniform. By doing so, the above-mentioned deformation and defect can be prevented more effectively. The difference in rigidity between the two regions can be reduced to nearly zero through making adjustments to locations and number of the plurality of openings 11a2 such that the density of opening per unit area is substantially the same throughout the core layer 11a.

(E2) In the substrate with built-in electronic components, the core layer 11a is made of a metal, and therefore, the weight of the core layer 11a is increased as compared with a core layer made of an insulator such as plastic. However, by forming the openings 11a2 in the core layer 11a, it is possible to reduce the weight of the core layer 11a.

Also, because the core layer 11a is made of a metal, and the electronic components 12 are housed in the respective housing portions 11a1 of the core layer 11a, the core layer 11a made of a metal can be used as a shield that blocks electromagnetic waves from reaching the electronic components 12. The core layer 11a made of a metal can also be used as ground wiring.

(E3) In the substrate with built-in electronic components, the respective openings 11a2 formed in the core layer 11a are filled with the insulator 11k, and therefore, even when the cross section of each opening 11a2 is made larger, the strength of the opening 11a2 and the surrounding region thereof can be reinforced by the insulator 11k.

Next, with reference to FIGS. 4A to 4C, modification examples of the opening 11a2 shown in FIGS. 1 and 2 will be explained.

Figure 4A:
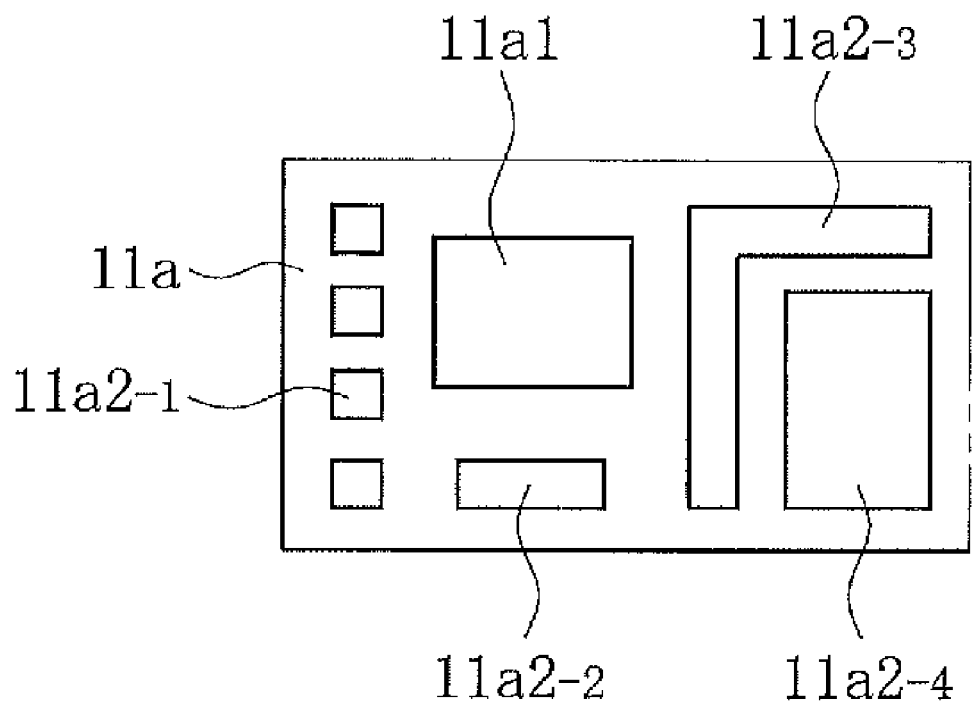
FIGS. 4A to 4C show modification examples of an opening shown in FIGS. 1 and 2.
Figure 4B:
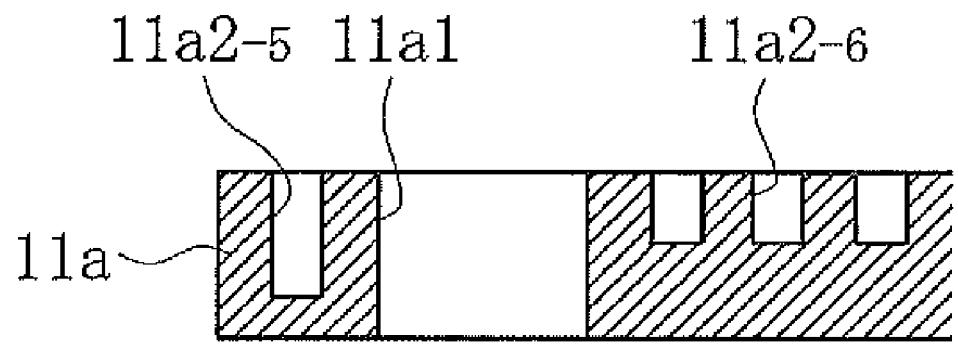
Figure 4C:
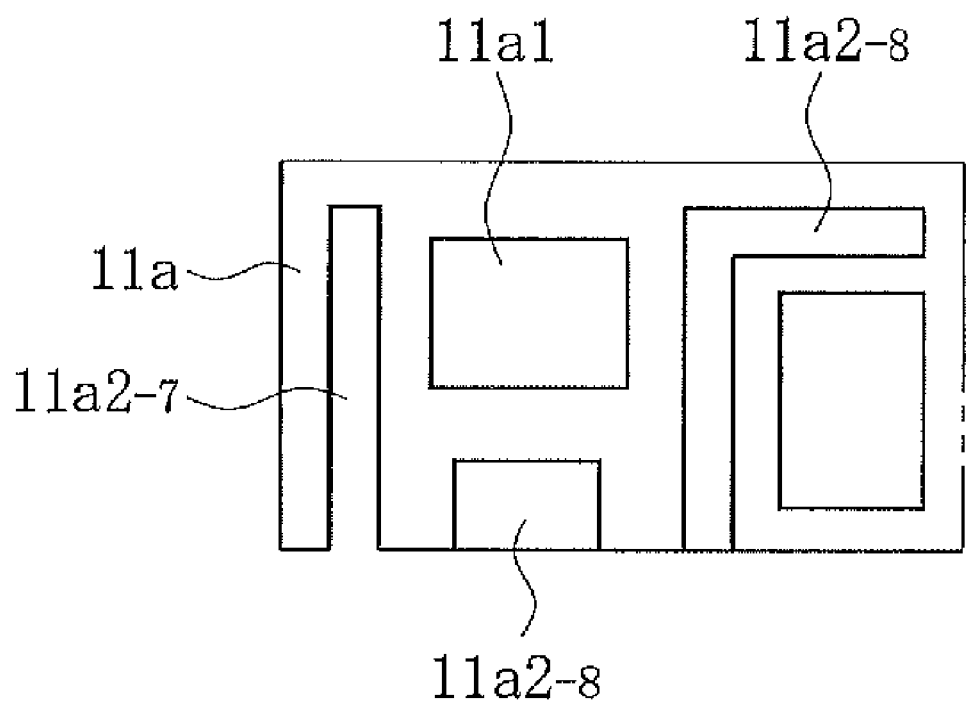

(M1) The opening 11a2 shown in FIGS. 1 and 2 was a penetrating hole that has a substantially circular cross section, but the cross section of the opening may be a substantially square shape (see the reference character 11a2-1 in FIG. 4A) or a substantially rectangular shape (see the reference character 11a2-2 in FIG. 4A). Alternatively, the opening 11a2 may have a substantially L-shaped cross section (see the reference character 11a2-3 in FIG. 4A), a substantially V-shaped cross section (not shown), or a substantially U-shaped cross section (not shown). The opening 11a2 that has a substantially circular cross section was shown to have a smaller opening area than that of the housing portion 11a1, but the opening area of the opening, which may alternatively have a substantially square, substantially rectangular, substantially L-shaped, substantially V-shaped, or substantially U-shaped cross section, may be substantially the same as that of the housing portion 11a1 (see the reference character 11a2-4 in FIG. 4A), or may be larger than that of the housing portion 11a1 (not shown). That is, even when the cross section shape or the opening area of the opening of the penetrating hole type is changed, effects similar to (E1) to (E3) above can be obtained.

When using the penetrating hole that has a smaller opening area than that of the housing portion 11a1, it is preferable to form a plurality of penetrating holes so as to line up at a certain interval along a part of the opening edge of the housing portion 11a1 as described above, that is, when the housing portion 11a1 has a substantially square cross section or a substantially rectangular cross section, it is preferable to form a plurality of penetrating holes that are lined up at a certain interval so as to be substantially parallel with at least one side of the opening of the housing portion 11a1. When a part of the opening edge of the penetrating hole has a shape similar to that of a part of the opening edge of the housing portion 11a1, it is preferable to form the penetrating hole such that the portion thereof having the similar shape is placed along the corresponding part of the opening edge of the housing portion 11a1. That is, when the housing portion 11a1 has a substantially square cross section or a substantially rectangular cross section, and the penetrating hole has a linear portion, it is preferable to form the penetrating hole such that the linear portion thereof is placed to be substantially parallel with at least one side of the opening of the housing portion 11a1.

When the opening of the penetrating hole type is formed to have a substantially square, substantially rectangular, substantially L-shaped, substantially V-shaped, or substantially U-shaped cross section, because the respective corners inside of the opening are square, a gap may be formed at each corner when the intermediate material flows in. Therefore, it is preferable to round the respective square corners to make it easier for the intermediate material to flow in. Among the substantially L-shaped, substantially V-shaped, and substantially U-shaped cross sections, it is preferable to adopt the substantially U-shaped cross section to allow for an efficient flow of the intermediate material in the opening.

(M2) In FIGS. 1 and 2 and (M1) above, the opening was described as a penetrating hole that has a substantially circular, substantially square, substantially rectangular, substantially L-shaped, substantially V-shaped, or substantially U-shaped cross section, but the opening may be a bottomed hole (see the reference characters 11a2-5 and 11a2-6 in FIG. 4B) that does not penetrate the core layer 11a in the thickness direction, and there is no special limitation on the depth thereof. Also, as described in (M1) above, when a bottomed hole that has a substantially circular, substantially square, substantially rectangular, substantially L-shaped, substantially V-shaped, or substantially U-shaped cross section is formed as the opening, the opening area of the opening may be substantially the same as that of the housing portion 11a1, or may be larger than that of the housing portion 11a1. That is, even when the opening is made of a bottomed hole, and the cross section shape, the opening area, or the depth thereof is changed, effects similar to (E1) to (E3) above can be obtained.

When using the bottomed hole that has a smaller opening area than that of the housing portion 11a1, as described in (M1) above, it is preferable to form a plurality of bottomed holes so as to line up at a certain interval along a part of the opening edge of the housing portion 11a1, that is, when the housing portion 11a1 has a substantially square cross section or a substantially rectangular cross section, it is preferable to form a plurality of bottomed holes that are lined up at a certain interval so as to be substantially parallel with at least one side of the opening of the housing portion 11a1. When a part of the opening edge of the bottomed hole has a shape similar to that of a part of the opening edge of the housing portion 11a1, it is preferable to form the bottomed hole such that the part having the similar shape is placed along the corresponding part of the opening edge of the housing portion 11a1. That is, when the housing portion 11a1 has a substantially square cross section or a substantially rectangular cross section, and the bottomed hole has a linear portion, it is preferable to form the bottomed hole such that the linear portion thereof is substantially parallel with at least one side of the opening of the housing portion 11a1.

When the opening of the bottomed hole type has a, substantially square, substantially rectangular, substantially L-shaped, substantially V-shaped, or substantially U-shaped cross section, it is preferable to round the respective square corners to make it easier for the intermediate material to flow in as described in (M1) above. Among the substantially L-shaped, substantially V-shaped, and substantially U-shaped cross sections, it is preferable to adopt the substantially U-shaped cross section to allow for an efficient flow of the intermediate material in the opening.

(M3) In FIGS. 1 and 2, and in (M1) and (M2) above, the opening was described as the penetrating hole or the bottomed hole, but the opening may be a slit (see the reference character 11a2-7 in FIG. 4C) that penetrates the core layer 11a in the thickness direction and that has at least one end thereof extended to reach the outer edge of the core layer 11a. Alternatively, the opening may be a groove (see the reference character 11a2-8 in FIG. 4C) that has a depth smaller than the thickness of the core layer 11a and that has at least one end thereof extended to reach the outer edge of the core layer 11a. Also, as described in (M1) above, when the opening of the slit type or the groove type has a substantially rectangular, substantially L-shaped, substantially V-shaped, or substantially U-shaped cross section, or the cross section thereof is formed by appropriately combining these shapes, the opening area of the opening may be substantially the same as that of the housing portion 11a1, or may be larger than that of the housing portion 11a1. That is, even when the opening is made of a slit or a groove, and the cross section shape, the opening area, or the depth (for the slit only) thereof is changed, effects similar to (E1) to (E3) above can be obtained.

When a part of the opening edge of the slit or the groove has a shape similar to that of a part of the opening edge of the housing portion 11a1, it is preferable to form the slit or the groove such that the part thereof having the similar shape is placed along the corresponding part of the opening edge of the housing portion 11a1. That is, when the housing portion 11a1 has a substantially square cross section or a substantially rectangular cross section, and the slit or the groove has a linear portion, it is preferable to form the slit or the groove such that the linear portion thereof is substantially parallel with at least one side of the opening of the housing portion 11a1.

When the opening of the slit type or the groove type has a substantially rectangular, substantially L-shaped, substantially V-shape, or substantially U-shaped cross section, or the cross section is formed by appropriately combining these shapes, it is preferable to round the respective square corners to make it easier for the intermediate material to flow in as described in (M1) above. Among the substantially L-shaped, substantially V-shaped, and substantially U-shaped cross sections and a cross section that is formed by appropriately combining these shapes, it is preferable to adopt the substantially U-shaped cross section or a cross section of a repeating pattern of the substantial U shapes, to allow for an efficient flow of the intermediate material in the opening.

(M4) In FIGS. 1 and 2, the opening 11a2 was shown as a penetrating hole that has a substantially circular cross section, but effects similar to (E1) to (E3) above can be obtained even when the openings include at least two different types of openings that are selected from the opening described in (M1), which is another type of penetrating hole, the opening described in (M2) above, which is the bottomed hole, and the opening described in (M3) above, which is the slit or the groove.

Next, modification examples of the substrate with built-in electronic components shown in FIGS. 1 to 3 will be explained.

(M5) Although the housing portion 11a1 shown in FIGS. 1 to 3 was a penetrating hole that has a substantially square or substantially rectangular cross section, the cross section shape of the housing portion 11a1 is not limited to the substantially square or substantially rectangular shape as long as a prescribed electronic component 12 can be housed therein. Even when a bottomed hole that does not penetrate the core layer 11a in the thickness direction is used as a housing portion, instead of the housing portion 11a1 of the penetrating hole type, effects similar to (E1) to (E3) above can be obtained.

(M6) The substrate 11 shown in FIGS. 1 to 3 includes two insulating layers 11b and 11d and two conductive layers 11c and 11e above the core layer 11a and two insulating layers 11f and 11h and two conductive layers 11g and 11i below the core layer 11a, but effects similar to (E1) to (E3) above can be obtained with a substrate that has one insulating layer and one conductive layer on each side of the core layer 11a, or a substrate that has three or more insulating layers and three or more conductive layers on each side of the core layer 11a.

(M7) In FIGS. 1 to 3, the core layer 11a made of a metal was shown, but effects similar to (E1) to (E3) above can be obtained when using a core layer that is made of an insulator such as plastic and that has the same thickness as the core layer 11a, or when using a core layer that is formed by laminating insulating layers that respectively have the same thicknesses as those of the insulating layers 11b, 11d, 11f, and 11h.

DESCRIPTION OF REFERENCE CHARACTERS 11 substrate
11a core layer
11a1 housing portion
11a2, 11a2-1, 11a2-2, 11a2-3, 11a2-4, 11a2-5, 11a2-6, 11a2-7, 11a2-8 opening
11b, 11d, 11f, 11h insulating layer
11c, 11e, 11g, 11i conductive layer
11c2, 11e2, 11g2, 11i2 via conductor
11j, 11k insulator
12 electronic component

The invention claimed is:

1. A substrate with a built-in electronic component, comprising:

a core layer that has a housing portion formed therein to house an electronic component, wherein the core layer has an opening formed therein, an entirety of the opening being filled with an insulator without having an electronic component inserted therein during any usage of the substrate so that the opening acts as a measure to reduce differences in rigidity among plural regions of the core layer during an entire course of usage of the substrate with the built-in electronic component.

2. The substrate with a built-in electronic component according to claim 1, wherein the core layer has a plurality of said openings therein.

3. The substrate with a built-in electronic component according to claim 1, wherein the opening is formed in a region of the core layer where the housing portion is not formed.

4. The substrate with a built-in electronic component according to claim 1, wherein the opening includes at least one of (1) a penetrating hole that penetrates the core layer in a thickness direction, (2) a bottomed hole that does not penetrate the core layer in the thickness direction, (3) a slit that penetrates the core layer in the thickness direction and that is extended such that at least one end thereof reaches an outer edge of the core layer, and (4) a groove that has a depth smaller than the thickness of the core layer and that is extended such that at least one end thereof reaches an outer edge of the core layer.

5. The substrate with a built-in electronic component according to claim 4, wherein, when the opening is the penetrating hole or the bottomed hole, and when an opening area of the penetrating hole or the bottomed hole is smaller than an opening area of the housing portion, a plurality of said openings are disposed so as to line up at a certain interval along a portion of an opening edge of the housing portion.

6. The substrate with a built-in electronic component according to claim 4, wherein, when the opening is the penetrating hole, the bottomed hole, the slit, or the groove, and when a part of an opening edge of said penetrating hole, said bottomed hole, said slit, or said groove has a section that has a shape similar to that of a part of an opening edge of the housing portion, the opening is disposed such that said section with the similar shape is placed along the part of the opening edge of the housing portion.

7. The substrate with a built-in electronic component according to claim 1, wherein the core layer is made of a metal, and a gap between an electronic component housed in the housing portion and an inner wall of the housing portion is filled with an insulator that insulates and seals the electronic component.

* * * * *